United States Patent [19]

Young, Jr.

[11] 4,309,630
[45] Jan. 5, 1982

[54] BUFFER CIRCUITRY

[75] Inventor: Ernst H. Young, Jr., Center Valley, Pa.

[73] Assignee: Bell Telephone Laboratories, Incorporated, Murray Hill, N.J.

[21] Appl. No.: 101,485

[22] Filed: Dec. 10, 1979

[51] Int. Cl.³ .................. H03K 17/693; H03K 17/04; H03K 17/094
[52] U.S. Cl. .................................... 307/584; 307/443; 307/450; 307/578; 307/581
[58] Field of Search ......... 307/205, 251, 270, DIG. 1, 307/DIG. 3, DIG. 4, 448, 450, 475, 482, 581, 584; 365/189, 207, 208, 222

[56] References Cited

U.S. PATENT DOCUMENTS

| 3,721,963 | 3/1973 | Jenne | 307/DIG. 4 X |
|---|---|---|---|
| 3,937,983 | 2/1976 | Reed | 307/DIG. 4 X |
| 4,071,783 | 1/1978 | Knepper | 307/DIG. 4 X |
| 4,096,398 | 6/1978 | Khaitan | 307/270 X |
| 4,103,189 | 7/1978 | Perlegos et al. | 307/DIG. 1 X |
| 4,161,040 | 7/1979 | Satoh | 307/DIG. 1 X |
| 4,219,743 | 8/1980 | Millns | 307/DIG. 4 X |

OTHER PUBLICATIONS

Bula et al., "High Speed, High Level Signal Driver", *IBM Tech. Discl. Bull.*, vol. 20, No. 4, p. 1517, 9/1977.
Lewis et al., "Two-Stage, Single-Phase Driver Circuit", *IBM Tech. Discl. Bull.*, vol. 17, No. 10, p. 2837, 3/1975.

*Primary Examiner*—Larry N. Anagnos
*Attorney, Agent, or Firm*—Walter G. Nilsen

[57] ABSTRACT

Buffer circuitry, which uses enhancement and depletion mode field effect transistors, has relatively high speed operation, low power dissipation, and requires a relatively modest amount of silicon area for implementation.

9 Claims, 3 Drawing Figures

BUFFER CIRCUITRY

BACKGROUND OF THE INVENTION

This invention relates to logic circuitry and, in particular, to buffer circuitry which is compatible with today's field effect transistor random access memories (RAMs).

Commercially available RAMs use output buffers which require more silicon area and/or power than is desirable.

It is desirable, particularly to multiple output memories, to have buffer circuitry which has relatively high speed operation, requires a modest amount of silicon area, and has relatively low power dissipation.

SUMMARY OF THE INVENTION

The present invention is essentially buffer circuitry comprising the series combination of a "pull-up" switching device and a "pull-down" switching device with an output terminal coupled therebetween. First circuit means is coupled to a control terminal of the pull-up device for causing the output terminal to be initially charged through the pull-up device to a "1" state. Second circuit means is coupled to a control terminal of the pull-down device and to the first circuit means for maintaining the pull-down device biased off while the output terminal is charged to a "1" state, and for then biasing the pull-down device off if a "1" if a "0" is applied to the first circuit means and for biasing the pull-down device on and causing the pull-up device to be biased off so as to cause the output terminal to assume a "0" is applied to the first circuit means. The initial charging of the output terminal to a "1" limits the need for a large pull-up device and thereby conserves the area necessary to implement the buffer circuitry and also facilitates high speed operation.

In one embodiment of the present invention the buffer circuitry essentially comprises first and second switching devices each comprising a control terminal and output circuitry, first and second inverter circuits (which may be denoted as first and second circuit means) each comprising at least one input terminal and one output terminal. The first input terminals of the first and second inverters serve as input terminals for the buffer circuitry. The output circuitry of the switching devices are coupled together and are coupled to an output terminal of the buffer circuitry. The output terminal of the first inverter is coupled to the control terminal of the second switching device and to a second input terminal of the second inverter. The output terminal of the second inverter is coupled to the control terminal of the first switching device.

At the beginning of a cycle of operation, the first and second input terminals of the buffer circuitry, which may be referred to as the input data signal terminal and the output enable signal terminal, are both at logic "1" potential levels. This causes both switching devices to be in a nonconductive (off) state and results in the output terminal electrically floating in potential. The output enable terminal is then pulsed to a logic "0" potential level. This causes the first switching device to be in a conductive (on) state and the output terminal to assume a potential level which is close to that of a first potential source which is coupled to the output circuitry of the first switching device. The potential level of the first potential source is at approximately the "1" logic level and, accordingly, the output terminal of the buffer circuitry assumes the "1" logic state. True input signal information is now applied to the input data signal terminal. If the input signal is a "1", the output terminal remains at the "1" level. If the input signal is a "0", the second switching device is turned on and the second inverter lowers the potential of the control terminal of the first switching device so as to turn it off. This causes the potential at the output terminal to drop to the potential level of a potential source coupled to the output circuitry of the second switching device, an output "0" level. At the end of the cycle both input buffer terminals are held at "1" potential levels and the output terminal again electrically floats in potential.

The present buffer circuitry is particularly useful as part of a semiconductor memory. It is usually coupled to the output of the sense amplifier. At the time address information is applied to the memory, the output enable signal terminal of the buffer is pulsed to a "0". The output of the buffer rises to the "1" level during the time the selected memory cells are activated and the sense amplifier is detecting the state of the selected cells. The first switching device, which is usually denoted as a pull-up transistor, need not be very large since the output terminal need only be charged to the "1" potential level by the time the sense amplifier has finished detecting the logic information from the selected memory cells. The second switching device, which is usually denoted as a pull-down transistor, is usually a relatively large device (has low resistance) such that the output potential level can be rapidly pulled down to a "0" if the input data signal is a "0". The output terminal of the buffer may be used as an input/output terminal of the memory since the output terminal is selectively electrically floating in potential and can be relatively easily forced to a "1" or a "0" level.

The particular circuit configuration of the buffer circuitry allows all devices used to be of modest size except the pull-down device. This facilitates the implementation of the buffer circuitry in a relatively modest area of silicon. The charging of the output terminal to the "1" level at the beginning of a cycle of operation facilitates high speed operation.

These and other features and advantages of the invention will be better understood from consideration of the following detailed description taken in conjunction with the accompanying drawing.

DETAILED DESCRIPTION

Figure 1:
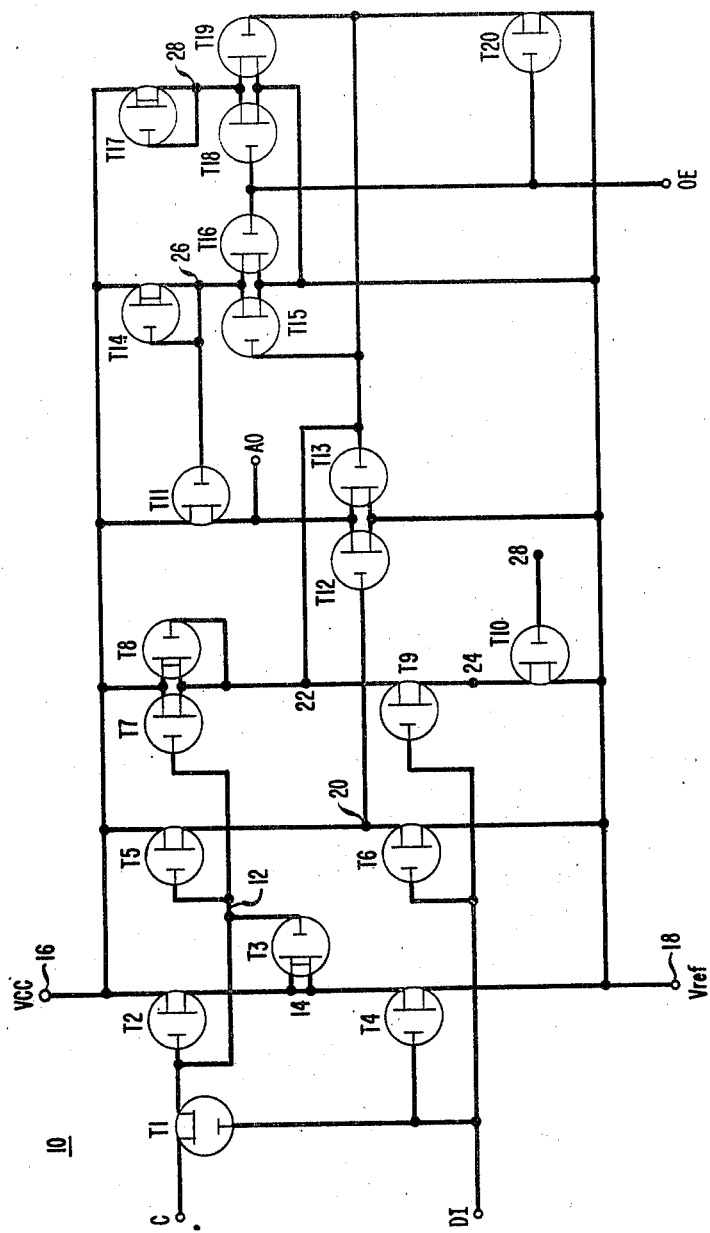
FIG. 1 illustrate buffer circuitry in accordance with one embodiment of the present invention.

Referring now to FIG. 1, there is illustrated buffer circuitry 10 which comprises field effect transistors T1, T2, T3, T4, T5, T6, T7, T8, T9, T10, T11, T12, T13, T14, T15, T16, T17, T18, T19, and T20. One particularly useful application for buffer circuitry 10 is as an output buffer circuit of a random access memory. A data input terminal DI of buffer circuitry 10 is coupled to a sense amplifier (not illustrated) of a random access memory (not illustrated). Buffer circuitry 10 selectively provides an output signal at terminal AO which is of the same logic state as that applied to input terminal DI.

T6 and T5 form a first inverter circuit with the gate terminal 12 and DI thereof serving as first and second input terminals and terminal 20 serving as an output terminal. T7, T8, and T9 form a second inverter circuit with the gate terminals 12 and DI serving as first and second input terminals and terminal 22 serving as an output terminal. T14, T15, and T16 form a third inverter circuit with the gate terminals 22 and OE of T15 and T16, respectively, serving as input terminals and terminal 26 serving as an output terminal. T17, T18, and T19 serve as a fourth inverter circuit with the gate terminals OE and 22 of T18 and T19, respectively, serving as input terminals and terminal 28 serving as an output terminal. T2 and T4 serve as a fifth inverter circuit with the gate terminals 12 and DI of T2 and T4, respectively, serving as input terminals and terminal 14 serving as an output terminal.

Transistors T1, T2, T4, T5, T6, T7, T9, T10, T11, T12, T13, T15, T16, T18, T19, and T20 may be referred to as switching devices with the gate terminal denoted as a control terminal and the drain-source circuit denoted as output circuitry. T3 may be denoted as a bootstrap capacitor or as capacitive circuit means. T8, T14, and T17 may be denoted as resistive circuit means, as resistive elements, load elements, or switching devices. The inverter circuits may be referred to as circuit means.

An input terminal C is coupled to the drain of T1. The source of T1 is coupled to the gates of T2, T3, T5, and T7 and to terminal 12. The gate of T1 is coupled to input terminal DI and to the gates of T4, T6, and T9. The drains of T2, T5, T7, T8, T11, T14, and T17 are all coupled together to a terminal 16 and to a power supply VCC. The sources of T4, T6, T10, T12, T13, T15, T16, T18, T19, and T20 are all coupled together to a terminal 18 and to a power supply Vref. The source of T2 is coupled to the drain and source of T3, the drain of T4, and to a terminal 14. The source of T5 is coupled to the drain of T6, the gate of T12, and to a terminal 20. The source and gate of T8 are coupled to the source of T7, the drain of T9, the gates of T13, T15, and T19, the drain of T20, and to a terminal 22. The source of T9 is coupled to the drain of T10 and to a terminal 24. The source of T11 is coupled to the drains of T12 and T13 and to an output terminal AO. The gate of T11 is coupled to the gate and source of T14, the drains of T15 and T16, and to a terminal 26. The gate and source of T17 are coupled to the drains of T18 and T19, the gate of T10, and to a terminal 28. The gates of T16 and T18 are coupled to the gate of T20 and to a terminal OE.

In a preferred embodiment, T8, T14, and T17 are depletion mode field effect transistors in which the gate of each is coupled to the respective source so as to effectively provide a resistive element. T3 is a depletion mode field effect transistor with the drain and source being connected together and serving as one terminal of a capacitor and the gate serving as the other terminal. The ratio of the impedance of T7 and/or T8 to the series combination of T9 and T10 or to T20 is selected such that with T7 and T20 on and T10 off, or with T7, T9, and T10 on and T20 off, the voltage of terminal 22 is close to that of Vref. The impedance levels of T2, T4, T5, and T6 are selected such that when all are on the potentials of terminals 14 and 20 are at or close to that of Vref. The impedance levels of T17, T18, and T19 are selected such that with T17 and either T18 or T19 biased on, the potential of terminal 28 is at or close to that of Vref. The impedances of T14, T15, and T16 are selected such that with T14 and either T15 or T16 biased on, the potential of terminal 26 is at or close to that of Vref. With T2, T5, and T7 biased on and T4, T6, and T9 and T20 biased off, terminals 14, 20, and 22 assume a potential level at or close to VCC. With T15, T16, T18, and T19 biased off terminals 26 and 28 assume a potential level at or near VCC.

Figure 2:
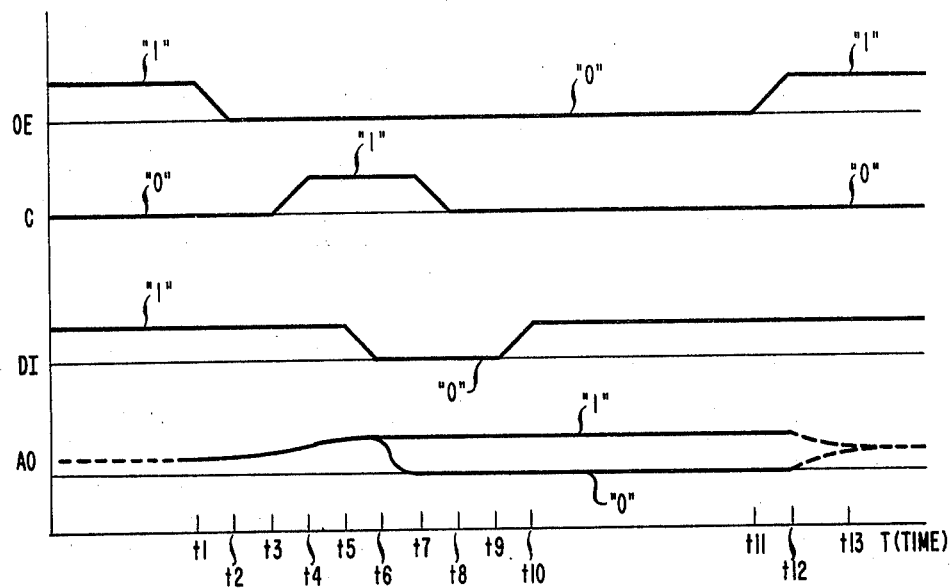
FIG. 2 illustrates voltage waveforms versus time which may be utilized with the buffer circuitry of FIG. 1.

Referring now to FIG. 2, there is graphically illustrated voltage waveforms applied to terminals OE, C, and DI, respectively, as a function of time (T), and the resulting output waveform appearing at terminal AO. At T=t1−, OE, C, and DI are at logic "1", "0", and "1" levels, respectively. The potential level of a "1" is at or near VCC and the potential level of a "0" is at or near Vref. This initial condition biases T4, T6, T9, T16, T18, and T20 on and biases T2, T5, and T7 off.

Terminal 20 is thus at a potential at or near Vref since T6 is biased on and T5 is biased off. Terminal 22 is at a potential level at or near Vref since T8, T9, and T20 are biased on and T10 is biased off. Terminal 26 is at a potential at or close to Vref since T14 and T16 are biased on. These conditions result in T11, T12, and T13 all being biased off and in output terminal AO being electrically isolated from VCC and Vref. Output terminal A0 thereby electrically floats in potential at somewhere between a "1" and "0", as is indicated by the dashed line of waveform A0 of FIG. 2. This is the initial condition prior to the time that valid input signal information is applied to buffer circuitry 10.

Between T=t1 and T=t2, the signal applied to terminal OE drops to a "0" level. This condition turns off previously biased on transistors T16, T18, and T20. This causes terminal 28 to increase in potential to a value at or near VCC which, in turn, biases on T10. T9 is still biased on and, accordingly, terminal 22 stays at a potential close to Vref since T8, T9, and T10 are all biased on. Thus, T13, T15, and T19 are biased off. The potential of terminal 20 stays at Vref and, accordingly, T12 also remains biased off. The potential of terminal 26 rises to VCC since T15 and T16 are now both biased off. This biases T11 on. Output terminal AO rises in potential toward VCC since T11 is on and T15 and T16 are off. If output terminal AO had been already floating in potential at or near VCC, it remains at said potential.

Between T=t3 and T=t4, terminal C rises in potential from a "0" level to a "1" level and terminals OE and DI remain at the "0" and "1" levels, respectively. At T=t4+, the gates of T2, T3, T5, and T7 are at a "1" potential level and, accordingly, T2, T3, T5, and T7 are biased on. Terminal OE is still held at a "0" level, DI is at a "1" level, and terminal AO continues to increase in potential towards the "1" level or to stay at the "1" level. Between T=t5 and T=t6, DI is either continued to be held at the "1" level of is pulsed to a "0" level. This represents input signal information being received by buffer circuitry 10. If it is assumed that DI stays at the "1" level, then all transistors remain biased as they were and terminal AO achieves or stays at the "1" potential level. If, however, terminal DI drops from a "1" level to a "0" level, then terminal AO will correspondingly drop from a "1" level to a "0" level. This can be seen as follows. When DI goes to a "0" level, T1, T4, T6, and T9 are biased off. Terminal 12, which is now isolated from terminal C because T1 is biased off, remains floating at the previously set "1" level. T2 remains biased on and T4 is biased off. Terminal 14, which had previously been at a potential of approximately Vref, now increases in potential towards VCC. T3, which had previously been biased on, acts as a bootstrap capacitor which couples the potential voltage change at terminal 14 to terminal 12. This causes terminal 12 to be increased from a potential which is at or close to VCC to a potential of VCC plus several volts. This causes terminals 20 and 22 to assume a potential of VCC. This heavily biases on T12, T13, T15, and T19. This causes terminal 26 to rapidly assume a potential close to Vref and thus biases T11 off. Accordingly, by T=t7, output terminal AO has been pulled down in potential by T12 and T13 from a value at or near a "1" level to the "0" level.

Between T=t7 and T=t8, terminal C is returned in potential to the "0" level. This has no effect on the potential of terminal AO.

If DI is at a "1" level at this time, then T1, T4, and T6 remain on and even though T2, T5, and T7 are biased on, the potentials at terminals 20 and 22 remain near Vref and, accordingly, T12, T13, T15, and T19 stay biased off. Since T15 and T16 are both biased off at this time, terminal 26 is at a potential of VCC and T11 remains biased on. This insures that output terminal AO remains at a potential near VCC, a "1". If DI is at a "0" level at this time, the change in potential of terminal C does not reach T2, T3, T5, and T7 since T1 is biased off. Thus, output terminal AO stays at the "0" level.

Between T=t9 and T=t10, terminal DI is returned to the "1" level. Since terminal C had previously been returned to the "0" level, terminal 12 assumes a "0" level when T1 is biased on and, accordingly, T2, T5 and T7 are biased off. Thus, terminal 20 returns to a potential level close to Vref. Since terminal 22 had been near VCC, T19 is on and terminal 28 is at a potential of Vref. This biases T10 off so that even though T9 becomes biased on, terminal 22 is held at or near VCC by resistive element T8. This maintains T13 in a biased on condition and thus causes output terminal A0 to stay at the "0" level. T11 is biased off at this time because the potential of terminal 26 is at or near Vref since T15 is biased on.

Between T=t11 and T=t12, terminal OE is returned in potential from the "0" level to the "1" level. This represents the end of a cycle of operation of output buffer circuitry 10. Output terminal AO again becomes essentially disconnected from VCC and Vref as T11, T12, and T13 all are biased off by T=t13. Thus, output terminal AO electrically floats in potential between a "1" and a "0" as it had at the beginning of a cycle of operation.

Output buffer circuitry 10 has been built as part of a 256 by 8 bit static random access memory that is formed on a single silicon chip that has been tested and found to be functional. All of the transistors used are n-channel insulated gate field effect transistors. T1, T2, T4, T5, T6, T7, T9, T10, T11, T12, T13, T15, T16, T18, T19, and T20 are enhancement mode transistors and T3, T8, T14, and T17 are depletion mode transistors. The power supply potentials used are VCC=+5 volts and Vref=0 volts. The width-to-length ratio and threshold voltage of each transistor used are given in the table below.

| Transistor | Threshold Voltage (Vth) | Width/Length |
|---|---|---|
| T1 | 0.5 | 8.00 |
| T2 | 0.5 | 8.00 |
| T3 | −2.5 | 1.25 |
| T4 | 1.0 | 16.00 |
| T5 | 0.5 | 24.00 |
| T6 | 1.0 | 40.00 |
| T7 | 0.5 | 10.00 |
| T8 | −2.5 | 1.00 |
| T9 | 1.0 | 24.00 |
| T10 | 1.0 | 30.00 |
| T11 | 0.5 | 104.00 |
| T12 | 1.0 | 400.00 |
| T13 | 1.0 | 120.00 |
| T14 | −2.5 | 4.80 |
| T15 | 1.0 | 28.00 |
| T16 | 1.0 | 20.00 |
| T17 | −2.5 | 1.43 |
| T18 | 1.0 | 4.80 |
| T19 | 1.0 | 8.00 |
| T20 | 1.0 | 12.00 |

The silicon area used for each of the output buffer circuits 10 is approximately 83 square mils. The time between T=t1 and T=t7, the time period during which OE goes low and output terminal AO assumes a valid output level, is typically 32 nanoseconds. The time between T=t5 and T=t7, the time period during which the data input DI is valid and the time output terminal AO assumes a valid output level, is typically 12 nanoseconds.

Figure 3:
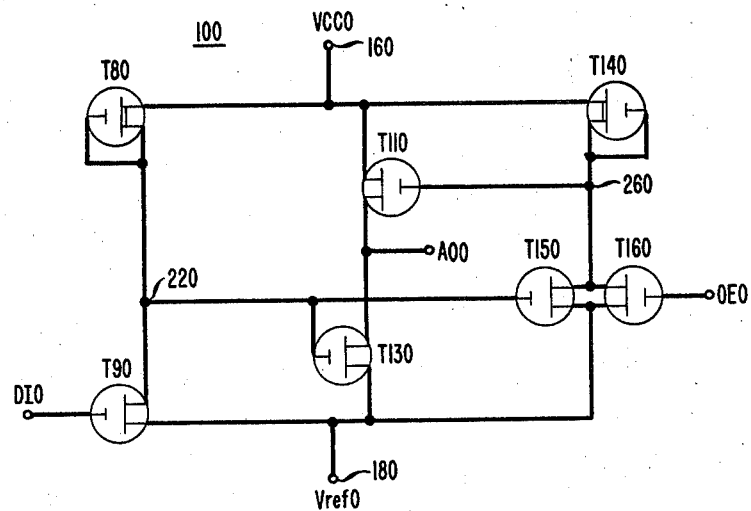
FIG. 3 illustrates buffer circuitry in accordance with another embodiment of the present invention.

Referring now to FIG. 3, there is illustrated buffer circuitry 100 which comprises field effect transistors T80, T90, T110, T130, T140, T150, and T160. Circuitry 100 is similar in structure and operation to buffer circuitry 10 of FIG. 1 and performs the same basic logic function. Transistors and circuit terminals of circuitry 100 which are similar to corresponding transistors and circuit terminals of circuitry 10 of FIG. 1 have the same designation with an extra "0" added.

The drains of T80, T110, and T140 are all coupled together to a terminal 160 and to a power supply VCCO. The sources of T90, T130, T150, and T160 are all coupled together to terminal 180 and to a reference potential Vref0. The gate and source of T80 are coupled to the drain of T90, the gates of T130 and T150, and to a terminal 220. The gate and source of T140 are coupled to the gate of T110, the drains of T150 and T160, and to a terminal 260. A first buffer circuitry 100 input terminal DI0 is coupled to the gate of T90. A buffer circuitry 100 output terminal AO0 is coupled to the source of T110 and to the drain of T130. A second buffer circuitry 100 input terminal, which is denoted as output enable terminal OE0, is coupled to the gate of T160.

The combination of T80 and T90 serves as a first inverter circuit with DI0 serving as an input terminal and 220 serving as an output terminal. The combination of T140, T150, and T160 serves as a second inverter circuit with 220 and OE0 serving as input terminals and 260 serving as an output terminal. T110 and T130 may be referred to as switching devices with the gate being referred to as a control terminal and the drain and source being referred to as output circuitry. The first and second inverter circuits may be referred to as first and second circuit means. T80 and T140 serve essentially as resistors and may be referred to as load elements, resistive circuit means, resistive elements, or as switching devices.

The impedance values of T80 and T90 are selected such that with T90 biased to allow conduction therethrough (being biased on), the potential of 220 is at a potential level close to Vref0. If T90 is biased so as to not allow conduction therethrough (being biased off), 220 is at a potential level at or close to VCC0. The impedance values of T140, T150, and T160 are selected such that with T150 and/or T160 biased to allow conduction therethrough (being biased on), 260 is at a potential level close to Vref0. If T150 and T160 are biased so as to not allow conduction therethrough (being biased off), 260 is at a potential level at or near VCC0.

In one embodiment, T90, T110, T130, T150, and T160 are n-channel enhancement mode field effect transistors, T80 and T140 are depletion mode field effect transistors, VCC0 is a positive potential, and Vref0 is ground potential. T110 is used as a pull-up transistor to selectively pull up the potential of AO0 to a level close to VCC0 and T130 is used as a pull-down transistor to selectively pull down the potential of AO0 to a level at or close to Vref0.

A typical cycle of operation of circuit 100 is as follows. At the beginning of the cycle, OE0 and DI0 are both held at a potential level near VCC0, a "1". This biases T90 and T160 on and causes 220 and 260 to assume potential levels close to Vref0. This biases T130 and T110 off and thus output terminal AO0 is electrically isolated from VCC0 and Vref0 and electrically floats in potential. OE0 is now pulsed to a potential level at or close to Vref0. This turns off T160. Since T150 and T160 are both turned off at this time, terminal 260 now rises in potential and assumes a potential level at or close to VCC0. This turns on T110 and thus output terminal AO0 assumes a potential level close to VCC0 (an output "1" signal) and is actively held at this potential level. After AO0 reaches the "1" potential level a data input signal, a "1" or a "0", is applied to input data terminal DI0. If the input data signal is a "1", there is essentially no change in the potential applied to DI0 and output terminal AO0 remains at a "1". If the input data signal is a "0", T90 is biased off and terminal 220 assumes a potential at or near VCC0. This turns on T130 and T150 and causes terminal 260 to drop in potential to a value close to Vref0 and thus turns off T110. As T130 turns on, terminal AO0 is pulled down in potential to Vref0 (an output "0" signal). While terminal OE0 is held at a "0" level, the output signal appearing at terminal AO0 is of the same logic state as the input signal applied to terminal DI0.

After the output signal appearing at terminal AO0 has been sensed, terminals OE0 and DI0 can both be returned to the "1" level and a new cycle of operation can start.

It is to be understood that the embodiments described herein are merely illustrative of the principles of the invention. Various modifications are possible within the scope of the invention. For example, T3 could be replaced by a variety of other types of capacitors and T8, T14, and T18 and T80 and T140 could be replaced by a variety of types of resistors, load elements, or switching devices. Still further, junction field effect transistors could be substituted for the enhancement mode transistors. Still further, the transistors could be p-channel field effect transistors providing the power supply polarities were appropriately modified. Still further, the inverter circuit configurations illustrated could be replaced by a variety of other circuit configurations which perform the same function. Still further, an additional inverter circuit with a capacitor, like the configuration of T2, T4, and T3, could be added to circuitry 100 of FIG. 3. Still further, T17, T18, and T19 of circuitry 10 of FIG. 1 can be eliminated if terminal 26 is then coupled to the gate of T10 and the impedance level of T14 is appropriately adjusted.

I claim:

1. Buffer circuitry comprising:
   first and second switching devices which each have a control terminal and output circuitry, the output circuitry of the devices being coupled together and being coupled to an output terminal of the buffer circuitry;
   the relative device sizes being such that the resistance of the first switching device being substantially greater than the resistance of the second switching device;
   a first inverter circuit having an input terminal which is coupled to a first input terminal of the buffer circuitry;
   a second inverter circuit having a first input terminal which is coupled to a second input terminal of the buffer circuitry and having a second input terminal which is coupled to the control terminal of the second switching device and to an output terminal of the first inverter circuit and having an output terminal which is coupled to the control terminal of the first switching device; and
   the first and second inverter circuits being configured to selectively control the first and second switching devices such that at the start of a cycle of operation the output terminal of the buffer circuitry essentially electrically floats in potential and then thereafter it first assumes a first logic level and then thereafter it stays at the first logic level if the first input terminal of the buffer is at the first logic level or it assumes a second logic level if the potential of the first input terminal is at the second logic level.

2. The buffer circuitry of claim 1 wherein each inverter circuit comprises a load element and a switching device having a control terminal and output circuitry.

3. The buffer circuitry of claim 2 wherein each load element comprises a switching device.

4. Buffer circuitry comprising:
   first, second, third, fourth, fifth, and sixth switching devices, each comprising a control terminal and output circuitry;
   first, second, third, and fourth inverter circuits, each comprising at least first and second input terminals and an output terminal;
   resistive circuit means;
   the first input terminal of the first inverter circuit being coupled to the first input terminal of the second inverter and being coupled to a first input terminal of the buffer circuitry;
   the output circuitry of the first switching device being coupled to a second input terminal of the buffer circuitry and to the second input terminals of the first and second inverter circuits;
   the output terminal of the first inverter circuit being coupled to the control terminal of the fourth switching device;
   the output terminal of the second inverter circuit being coupled to the control terminal of the fifth switching device, the first input terminals of the third and fourth inverter circuits, and resistive circuit means, and to the output circuitry of the sixth switching device;
   the output circuitry of the fourth and fifth switching devices being coupled to the output circuitry of the third switching device and to an output terminal of the buffer circuitry;

the output terminal of the third inverter circuit being coupled to the control terminal of the third switching device;

the output terminal of the fourth inverter circuit being coupled to the control terminal of the second switching device;

the output circuitry of the second switching device being coupled to the second inverter circuit; and the control terminal of the sixth switching device being coupled to the second input terminals of the third and fourth inverter circuits and to a third buffer circuitry input terminal.

5. The buffer circuitry of claim 4 further comprising: capacitive circuit means; and a fifth inverter circuit having a first input terminal coupled to the first input terminal of the buffer circuitry and a second input terminal coupled to the second input terminal of the first inverter circuit and having an output terminal which is coupled to the second input terminal through the capacitive circuit means.

6. The buffer circuitry of claim 5 wherein:

each inverter circuit comprises a separate pair of field effect transistors with the output circuitry of each of the two transistors being coupled to the other; and the resistive means is a depletion mode field effect transistor.

7. Buffer circuitry (100) comprising:

a first switching device (T110) having a control terminal (260) and having output circuitry (160) adapted to be coupled to a first potential source (VCCO);

a second switching device (T130) having a control terminal (220) and having output circuitry (180) adapted to be coupled to a second potential source (Vref0);

the output circuitry of the first (T110) and second (T130) switching devices being coupled together and being coupled to an output terminal (AC0) of the buffer circuitry (100);

first (T80, T90) and second (T140, T150, T160) circuit means coupled to the control terminals (220, 260) of the second (T130) and first (T110) switching devices, respectively, for controlling each device;

the first circuit means (T80, T90) also being coupled to the second circuit means (T140, T150, T160) for selectively controlling the second circuit means (T140, T150, T160) so as to selectively control the first switching device (T110);

first (DIO) and second (OEO) separate buffer circuitry (100) input terminals being coupled to the first (T80, T90) and second (T140, T150, T160) circuit means, respectively;

the relative device sizes being such that the resistance of the first switching device being substantially greater than the resistance of the second switching device; and the first and second circuit means being configured to selectively control devices such that at the start of a cycle of operation the output terminal of the buffer circuitry essentially electrically floats in potential and then thereafter it assumes the first potential source level and then thereafter it stays at the first potential source level if a first input terminal of the buffer circuitry is set to the potential level of the first potential source or it assumes the potential level of the second potential source if the first input terminal of the buffer circuitry is set to the potential level of the second potential source.

8. Buffer circuitry having at least two input terminals and one output terminal comprising:

first and second switching devices each having a control terminal and output circuitry, the output circuitry of both devices being coupled to the output terminal;

first and second inverter circuits each having an input terminal coupled to a separate one of the input terminals of the buffer circuitry and each having an output terminal coupled to a separate control terminal of one of the switching devices;

the second inverter circuit having a second input terminal coupled to the output terminal of the first inverter circuit;

the relative device sizes being such that the resistance of the first switching device being substantially greater than the resistance of the second switching device; and the first and second inverter circuits being configured to selectively control the first and second switching devices such that at the start of a cycle of operation the output terminal of the buffer circuitry essentially electrically floats in potential and then thereafter it assumes a first logic level and then thereafter it stays at the first logic level if the first input terminal of the buffer is at the first logic level or it assumes a second logic level if the potential of the first input terminal is at the second logic level.

9. Buffer circuitry comprising:

the series combination of a pull-up switching device and a pull-down switching device with an output terminal coupled therebetween;

the resistance of the pull-up switching device being substantially greater than the resistance of the pull-down switching device;

first circuit means coupled to a control terminal of the pull-up device for selectively biasing the pull-up device on so as to allow the output terminal to assume a first output voltage state (logic level);

second circuit means coupled to a control terminal of the pull-down device and to the first circuit means for maintaining the pull-down device biased off while the output terminal is assuming the first output voltage level (logic state) and for then biasing the pull-down device off if essentially the same logic state is applied to an input terminal of the second circuit means and for biasing the pull-down device on and causing the pull-up device to be biased off so as to allow the output terminal to assume a second voltage level (logic state) if, and only if, said second logic state is applied to the input terminal of the second circuit means; and the first and second circuit means being adapted to allow the output terminal of the buffer circuitry to selectively electrically float in potential.

* * * * *

UNITED STATES PATENT AND TRADEMARK OFFICE
CERTIFICATE OF CORRECTION

PATENT NO. : 4,309,630
DATED : January 5, 1982
INVENTOR(S) : Ernst H. Young, Jr.

It is certified that error appears in the above-identified patent and that said Letters Patent are hereby corrected as shown below:

Column 1, line 12, "to" should read --in--; line 29, delete "if a "0""; line 33, after "0", insert --if a "0"--.
Column 3, line 4, "terminal" should read --terminals--.
Column 4, line 56, "of" should read --or--. Column 8, line 64, "and" should read --the--. Column 10, line 42, before "the", insert --the relative device sizes being such that--; line 62, "adapted" should read --configured--.
On the Title page, change attorney name of "Walter G. Nilsen" to --Irwin Ostroff--.

Signed and Sealed this

Fourth Day of May 1982

[SEAL]

Attest:

Attesting Officer

GERALD J. MOSSINGHOFF

Commissioner of Patents and Trademarks